United States Patent [19]

Ueno

[11] Patent Number: 5,036,543
[45] Date of Patent: Jul. 30, 1991

[54] NOISE SUPPRESSION APPARATUS FOR FM RECEIVER

[75] Inventor: Eiji Ueno, Saitama, Japan

[73] Assignee: Pioneer Electronic Corporation, Tokyo, Japan

[21] Appl. No.: 543,305

[22] Filed: Jun. 26, 1990

[30] Foreign Application Priority Data

Jun. 30, 1989 [JP] Japan .................. 1-168565
Jun. 30, 1989 [JP] Japan .................. 1-168566

[51] Int. Cl.$^5$ ........................................ H04B 15/00
[52] U.S. Cl. ........................... 381/94; 381/10; 381/11; 381/13; 381/93; 455/222; 455/223
[58] Field of Search ............... 381/93, 94, 13, 10, 381/11; 455/222, 223

[56] References Cited

U.S. PATENT DOCUMENTS

| | | | |
|---|---|---|---|
| 4,416,024 | 11/1983 | Ugari et al. | 381/11 |
| 4,419,541 | 12/1983 | Kishi et al. | 455/223 |
| 4,480,335 | 10/1984 | Kishi | 381/13 |
| 4,899,389 | 2/1990 | Amazawa | 381/94 |

FOREIGN PATENT DOCUMENTS 59-31077 9/1984 Japan .

Primary Examiner—Jin F. Ng
Assistant Examiner—Jack Chiang
Attorney, Agent, or Firm—Sughrue, Mion, Zinn Macpeak & Seas

[57] ABSTRACT

A noise component is extracted either from FM-detected output or from the so-called signal meter in the intermediate frequency amplifier. The noise component is amplified and rectified to provide a d-c signal indicative of the noise level. The rectified noise is then shaped to produce a control signal having a predetermined level and a width. The control signal is supplied to the gate circuit to control the opening and closing of the gate through which the FM detected output passes. The gate is closed during a period when the pulse noise is superimposed on the FM detected output, and is opened during a period when the pulse noise is not superimposed to the FM detected output. In the mean time, the rectified d-c signal is smoothed out to be used as a control signal for controlling the stereo separation, the attenuation of high frequency component of the MPX-demodulated audio outputs, and the overall signal level of the audio outputs.

4 Claims, 5 Drawing Sheets

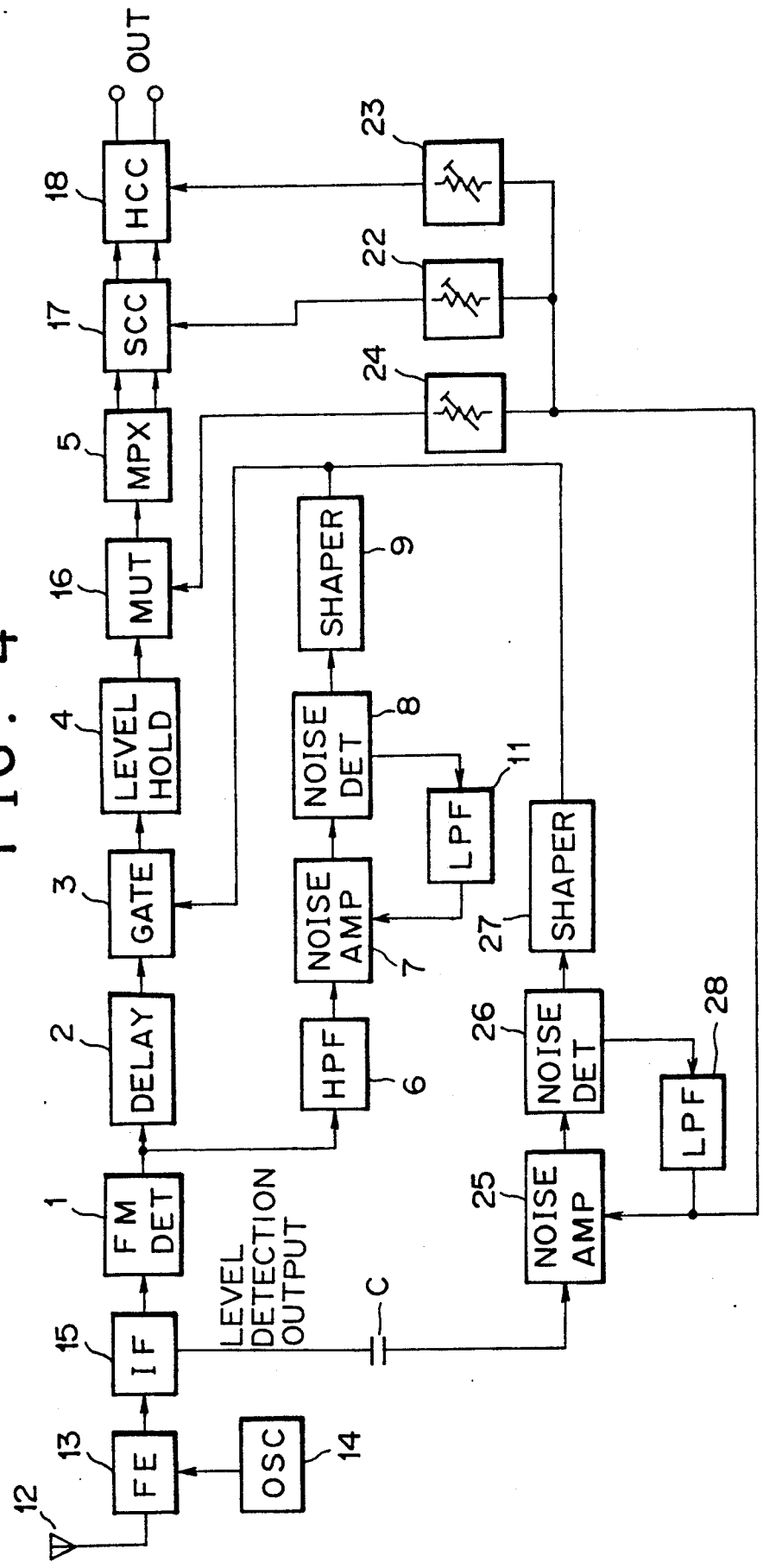

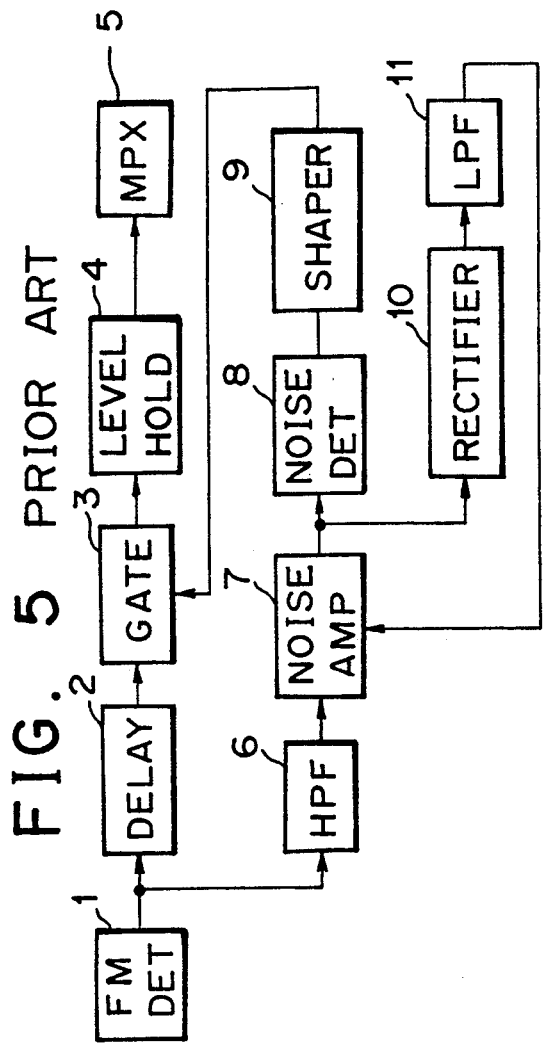
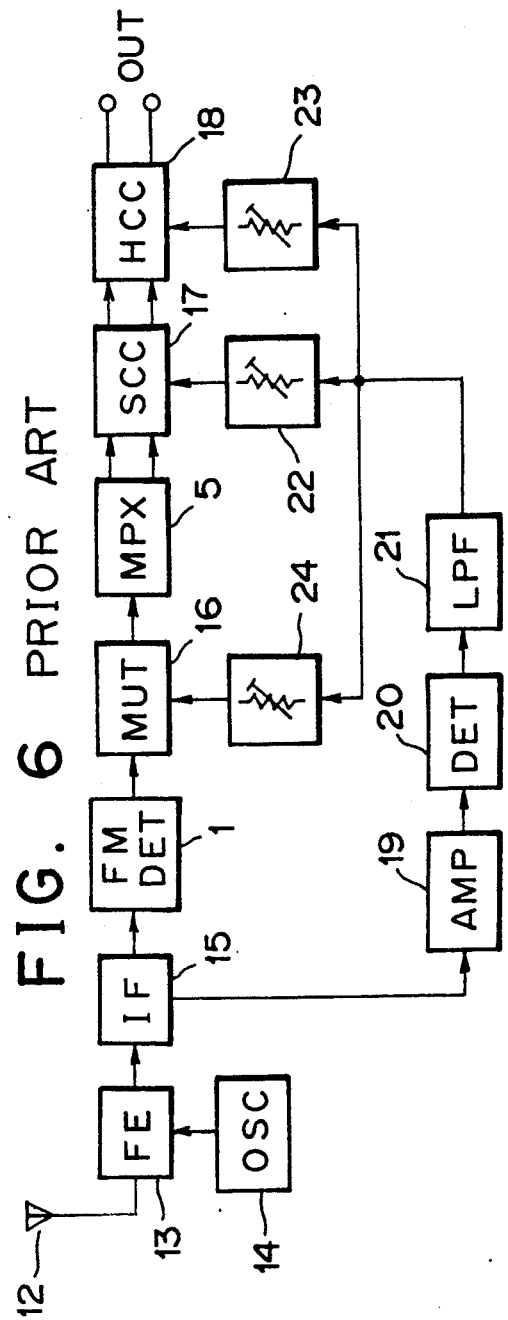

NOISE SUPPRESSION APPARATUS FOR FM RECEIVER

BACKGROUND OF THE INVENTION

1. Field of the Invention

The present invention relates to a noise suppression apparatus for an FM radio receiver in which incoming noise, particularly pulse noise, is removed.

2. Prior Art

FIG. 5 shows a prior art pulse noise removing apparatus for the FM radio receiver. An FM-detected signal which is outputted from an FM detection circuit 1 of the receiver is supplied to a delay circuit 2 in the form of an LPF (low-pass filter) where the signal is delayed by a predetermined length of time. The output of the circuit 2 is supplied to an MPX circuit (multiplex stereo demodulation circuit) 5 through a gate circuit 3 and then a level-hold circuit 4. The delay circuit 2 is for providing the signal with a delay time equal to the time required for the signal supplied to an HPF 6 to exit a shaper 9. The FM-detected signal is supplied to the HPF 6 (high-pass filter) for noise detection. The noise component through the HPF 6 is amplified by a noise amplifier 7 and is then supplied to a noise detection circuit 8.

The noise detection circuit 8 includes a rectifying circuit for rectifying the output of the noise amplifier 7, and a level comparator circuit for comparing the output level of the rectifier with a predetermined reference level. The output of the noise detection circuit 8 is supplied to the shaper 9. The shaper 9 is, for example, in the form of one shot multivibrator which converts the noise detection output into a pulse having a predetermined height and a predetermined width and sends the pulse to the gate circuit 3. The gate circuit 3 is driven by the pulse from the shaper 9 into a closed condition where the delayed output level just before the gate circuit 3 is closed is held by the level-hold circuit 4 and is sent to the MPX circuit 5. By this arrangement, the pulse noise is removed from the signal before it is supplied to the MPX circuit 5. The output signal of the noise amplifier 7 is rectified by a rectifier 10 the output of which is then supplied to an LPF (low-pass filter) 11. The rectified output is smoothed out by the LPF 11 to provide a d-c voltage in accordance with the noise level and feeds back to the noise amplifier 7. The thus described structural elements 7, 8, and 11 form an AGC loop for the noise.

With the FM receiver, white noise increases as the incoming r-f signal level becomes weaker, in which case the noise level in the output signal of the HPF 6 increases. Therefore higher the noise level is, the higher is the d-c signal level as an AGC signal outputted from the LPF 11. The higher d-c level causes the gain of the noise amplifier 7 to go down. Thus, the noise level supplied to the noise detection circuit 8 from the noise amplifier 7 is maintained at a substantially constant level, thereby preventing the saturation of the noise amplifier 7. In this type of pulse noise removing apparatus, the high frequency component in the FM-detected output is rectified and then smoothed out to produce the d-c signal which indicates the average level of the high frequency component of the FM detected output. Any amplitudes greater than that average level are detected as pulse noise to control the gate circuit to close for noise removal.

Removing the pulse noise alone is not sufficient to suppress the noise to an acceptable level. Various characteristics of the FM broadcast wave are susceptible to variations in terrain. Particularly, on-vehicle receivers experience this kinds of changes in characteristics of the FM broadcast wave. Thus, skip noise or intermittent noise and multipath noise affect the signal to result in a significant deterioration in signal-to-noise ratio particularly when the signal strength is weak.

For example, Japanese Utility Model Publication No. 5931077 shown in FIG. 6 discloses an FM stereo receiver capable of overcoming the above-described drawbacks. Elements similar to those in FIG. 5 have been given the same reference numerals.

In FIG. 6, an r-f signal through antenna 12 is fed to a front end 13 where the r-f signal is mixed with the local frequency from a local oscillator 14 to produce an intermediate frequency. The intermediate frequency is amplified by an i-f amplifier 15 and is then frequency detected by an FM detection circuit 1. The detected output passes through a variable attenuation circuit 16 in the form of a variable attenuator circuit to an MPX (stereo demodulation) circuit 5 where the signal is separated into the left and the right signals. The left and right signals are then controlled their separation by a separation control circuit 17.

The left and right signals are then supplied to a high frequency characteristic control circuit 18 to be cut their high frequency component before they are outputted to the output terminals. The i-f amplifier 15 is followed by an amplifier 19 for amplifying the intermediate frequency signal, a detector 20 for envelope-detecting the output of the amplifier 19, and an LPF (low-pass filter) 21 in series. The d-c signal provided by the LPF 21 is applied to a first, second, and third level setting circuits 22, 23, and 24 each of which outputs a control signal. The control signal from control signal from the first level setting circuit 22 is supplied to a separation control circuit 17 which mixes the left signal and the right signal by gradually increasing the level of one of the signals relative to the other signal. Since the noise component in the left and right channels are opposite in polarity, superimposing the two signals together causes the noise component in the two channels to cancel out each other while simply superimposing the audio signals. As the signal level that is added to the other signal is increased, the stereo signal outputted from the output terminals OUT will be increasingly poor in stereo separation, becoming more like a monaural signal. The control signal from the second level setting circuit 23 is supplied to a high frequency characteristic control circuit 18 to gradually attenuate the high frequency component in the left and right signals as the r-f signal level decreases. The control signal from the third level setting circuit 24 is supplied to the variable attenuation circuit 16 to progressively decrease the input level to the MPX circuit 5 in accordance with the level of the r-f signal level decrease.

Thus, as the r-f signal strength decreases, the separation control circuit 17 first operates to switch its operating mode from the stereo mode to the monaural mode to prevent the increase in noise. Then, the frequency characteristic control circuit 18 goes into operation to prevent a further increase in noise as the r-f signal strength further decreases. When the noise level tends to increase even further, the variable attenuation circuit 16 operates to smoothly decrease the signal level supplied to the MPX circuit 5. The sequential operation of the respective control circuits 22, 23, and 24 described above reduces the virtual noise to a reasonably low level.

The aforementioned pulse noise suppressing means and the noise suppressing means which includes the separation control, exist separately, and the d-c control signal for controlling the operations of these means are provided by separate circuits. This leads to the problem of a greater complexity of circuit configuration.

SUMMARY OF THE INVENTION

A noise component is extracted either from FM-detected output or from the so-called signal meter in the intermediate frequency amplifier. The noise component is amplified and rectified to provide a d-c signal indicative of the noise level. The rectified noise is then shaped to produce a control signal having a predetermined level and a width. The control signal is supplied to the gate circuit to control the opening and closing of the gate through which the FM detected output passes. The gate is closed during a period when the pulse noise is superimposed on the FM detected output, and is opened during a period when the pulse noise is not superimposed to the FM detected output. In the mean time, the rectified d-c signal is smoothed out to be used as a control signal for controlling the stereo separation, the attenuation of high frequency component of the MPX-demodulated audio outputs, and the overall signal level of the audio outputs.

BRIEF DESCRIPTION OF THE DRAWINGS

Features and other objects of the invention will be more apparent from the description of preferred embodiments with reference to the accompanying drawings in which:

FIGS. 1-4 are block diagrams showing a first to a fourth embodiments of a noise suppression apparatus for an FM receiver according to the present invention, respectively; and FIGS. 5-6 are block diagrams showing prior art apparatuses.

DETAILED DESCRIPTION OF THE INVENTION

First Embodiment

Figure 1:
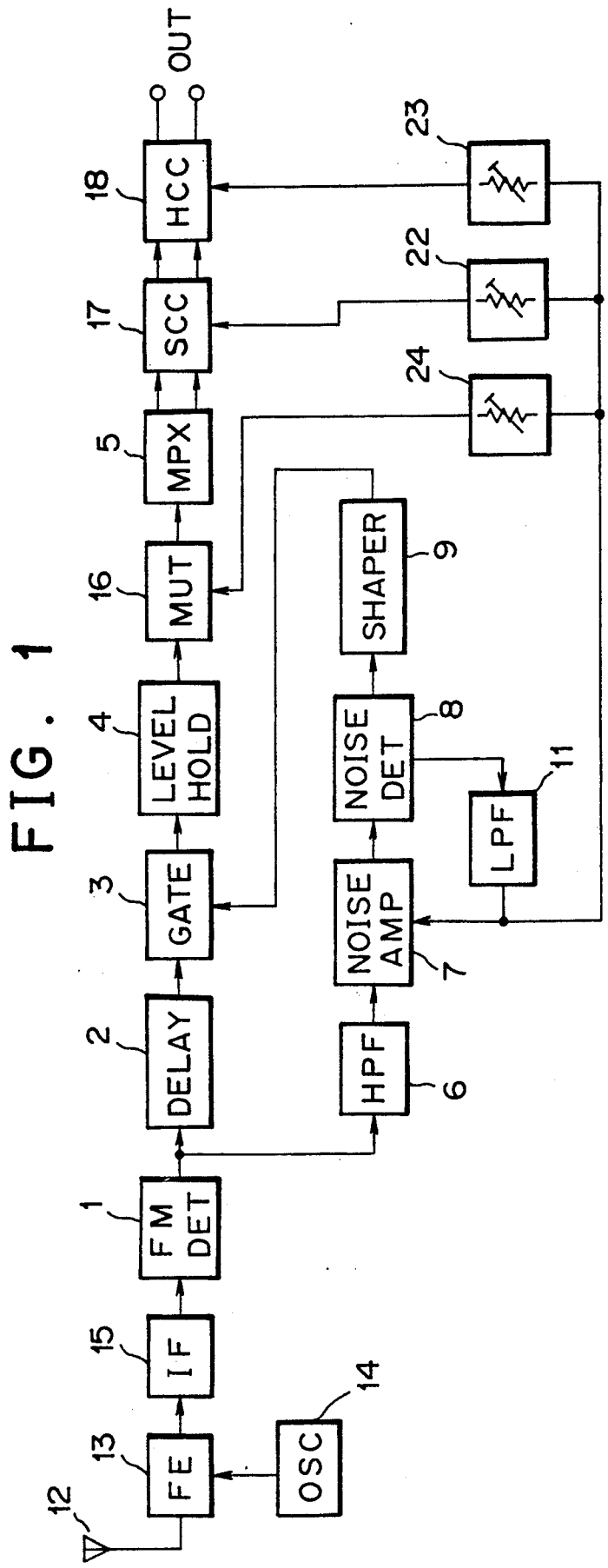

FIG. 1 shows a first embodiment of a noise suppression apparatus according to the present invention. Elements similar to those in FIGS. 5 and 6 have been given the same reference numerals and the detailed description thereof is omitted.

The high frequency component above the audio signals in the FM-detected output is extracted by a high pass filter or HPF 6 to utilize this high frequency component as a signal by which a gate 3 is controlled its opening and closing to remove the pulse noise from the audio signal through the gate 3. That is, the high frequency component is amplified by a noise amplifier 7 the output of which is fed to a noise detection circuit 8, which has a rectifier and a comparator. The amplified noise is rectified by the rectifier to provide a d-c signal, and is then compared with a predetermined reference level to provide a control signal. The comparator output is then converted by the shaper into a pulse signal having a predetermined amplitude and a width for controlling the opening and closing of the gate 3. The output of the shaper 9 is fed to the gate 3. The output level of the gate just before the gate circuit 3 is closed is held by the level-hold circuit 4 and is sent to the MPX circuit 5. The rectifier output is supplied to LPF 11 to smooth out the pulsating component. The output of LPF 11 as a gain controlling signal is applied to the noise amplifier 7 to control the gain thereof, causing the gain to increase when the noise input to the amplifier 7 is low and to decrease when the noise input is relatively high. This gain control action prevents the saturation of amplifier 7 to improve the capability of detecting the pulse noise component. In other words, the noise amplifier 7, noise detection circuit 8, LPF 11 form an AGC loop.

The d-c signal obtained by the LPF 11 has a level representative of the noise level in the FM-detected output and is also applied to level setting circuits 22, 23, and 24.

The control signal from the first level setting circuit 22 is supplied to a separation control circuit 17 to switch the separation mode from stereo to monaural when the d-c signal is relatively high. The control signal from the second level setting circuit 23 is supplied to a high frequency characteristic control circuit 18 to progressively attenuate the high frequency component in the demodulated signals as the d-c signal increases. The control signal from the third level setting circuit 24 is supplied to an MUT 16, which is a variable attenuation circuit, to progressively decrease the level of the MPX-demodulated signals with increasing d-c signal level from LPF 11.

Thus, as the r-f signal strength decreases, the separation control circuit 17 first operates to switch its operating mode from the stereo mode to the monaural mode to prevent the increase in noise. Then, the frequency characteristic control circuit 18 goes into operation to prevent a further increase in noise as the r-f signal strength further decreases. When the noise level tends to increase even further, the MUT 16 operates to progressively decrease the signal level supplied to the MPX circuit 5. The sequential operation of the respective control circuits 22, 23, and 24 described above reduces the virtual noise to a reasonably low level.

Second Embodiment

Figure 2:
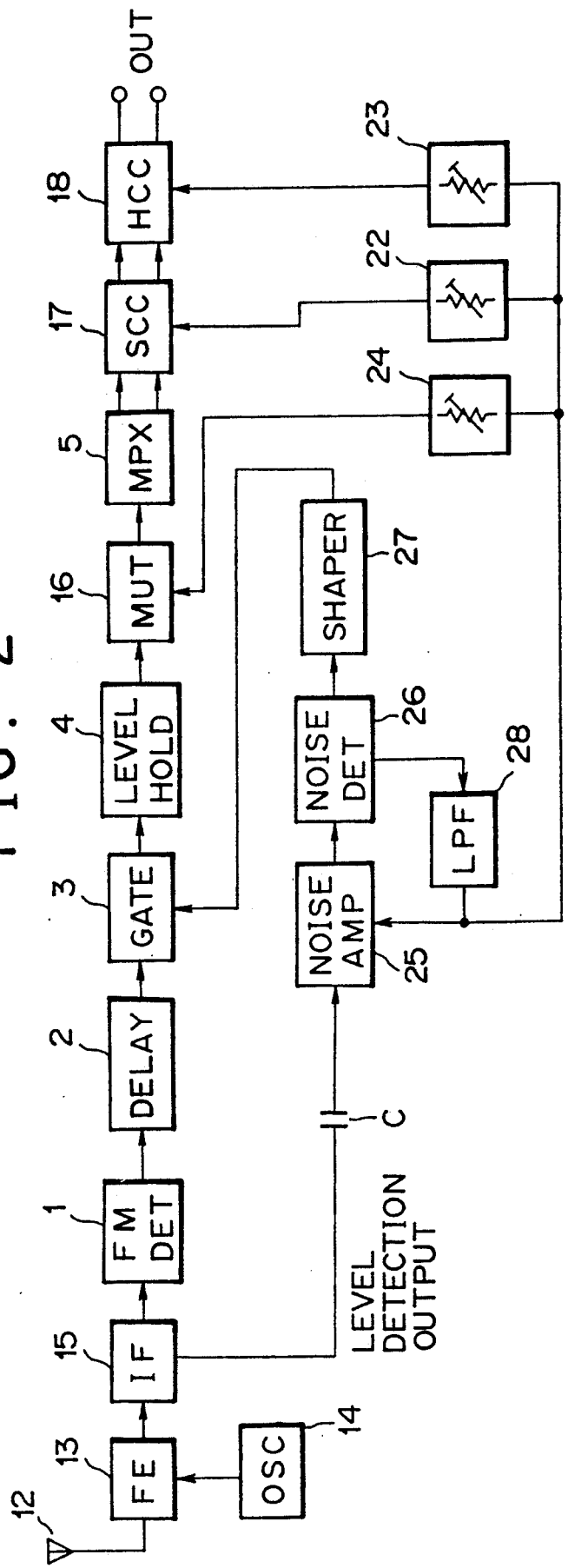

FIG. 2 shows a second embodiment of the invention where elements similar to those in FIG. 1 have been given the same references.

In the second embodiment, the noise portion in the intermediate frequency signal is extracted through a capacitor C from the level detection output or so-called signal strength meter in the amplifier 15. The noise is then supplied to a noise amplifier 25. The output of the noise amplifier 25 is then rectified by a noise detector 26 to produce a d-c signal indicative of the amount of noise. Then, the output of the noise detector 26 is supplied to an LPF 28 to smooth out the pulsating component. The output of the LPF 28 is applied to the noise amplifier 25 to control the gain thereof, causing the gain to increase when the noise input thereto is low and to decrease when the noise input thereto is relatively high. This gain control action prevents the saturation of amplifier 25. The noise detecting circuit 26, shaper 27, and LPF 28 are similar to those shown in FIG. 1.

The d-c signal obtained by the LPF 28 has a level representative of the noise level in the intermediate frequency signal and is also applied to level setting circuits 22, 23, and 24.

The control signal from the first level setting circuit 22 is supplied to a separation control circuit 17 to switch the separation mode from stereo to monaural when the d-c signal is relatively high. The control signal from the second level setting circuit 23 is supplied to a high frequency characteristic control circuit 18 to progressively attenuate the high frequency component in the demodulated signal as the d-c signal increases. The control signal from the third level setting circuit 24 is supplied to the MUT 16, which is a variable attenuation circuit, to progressively decrease the level of the MPX-demodulated signal with increasing d-c signal level. The sequence in which the level setting circuits 22-24 operate is the same as that in the first embodiment.

Third Embodiment

Figure 3:
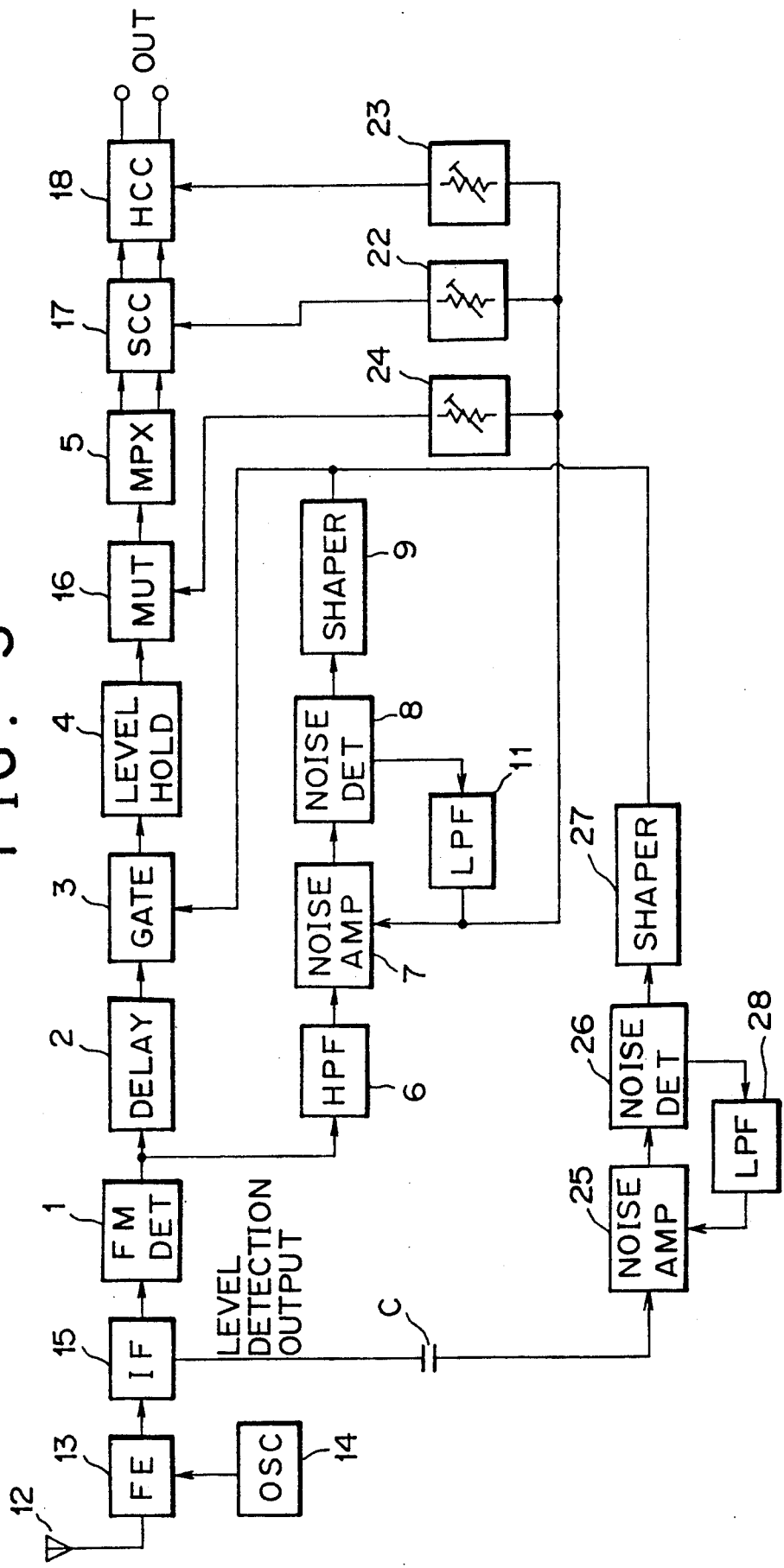

FIG. 3 shows a third embodiment of the invention, where elements similar to those in FIGS. 1 and 2. As in the first embodiment, the d-c signal to be supplied to level setting circuits 22, 23, and 24 is derived from the output of the FM detection circuit 1. The control signal for the gate circuit 3 is derived both from the output of the FM detection circuit 1 and the level detection output or the so-called signal meter of the intermediate frequency amplifier 15. This is so arranged for the following reason.

In the frequency modulated broadcast, when the antenna input level decreases below a certain level, the amount of white noise contained in the FM-detected output increases to levels as high as the pulse noise, which causes a problem in detecting the pulse noise in the sea of white noise. In contrast to this, when the intermediate frequency signal decreases with decreasing r-f input level, the amount of the pulse noise in the intermediate frequency signal will not decrease.

Conversely, when the antenna input level is high, the output of the intermediate frequency amplifier 15 is sufficiently amplitude-limited by the amplitude-limiting operation of the amplifier 15, causing a difficulty in detecting the pulse noise from the output of the intermediate frequency amplifier, whereas the white noise in the FM-detected output is decreased, permitting the pulse noise in the white noise to be easily detected.

Thus, the gate 3 is controlled by the control signal derived from the pulse noise that is detected from the FM-detected output when the incoming r-f signal is strong, and by the control signal derived from the pulse noise that is detected from the output of the intermediate frequency amplifier 15 when the incoming r-f signal is rather weak.

The sequence in which the level setting circuits 22-24 operate is the same as that in the first embodiment.

Fourth Embodiment

FIG. 4 illustrates a fourth embodiment, in which elements similar to those in FIG. 3 have been given the same references. The operation of FIG. 4 is the same as that of FIG. 3 except that the d-c signal supplied to level setting circuits 22, 23, and 24 is derived from the output of the intermediate frequency amplifier 15 is supplied from LPF 28.

What is claimed is:

1. A noise suppression apparatus for an FM receiver comprising:
   amplifying means (6,7) for extracting a noise component from an FM detected signal;
   noise detecting means (8,9) for outputting a control signal when a level of said noise component exceeds a predetermined level;
   gate means (3) through which said FM-detected signal passes, said gate means being closed by said control signal to inhibit the passage of said FM-detected signal;
   d-c signal producing means for producing a d-c signal in accordance with an output level of said amplifying means (6,7) to control a gain of said amplifying means (6,7);
   stereo separation control means (22) for continuously varying a stereo separation between a left channel and a right channel of a speaker output of the FM receiver in accordance with said level of the noise component when said noise component decreases below a predetermined level; and
   high frequency response control means (23) for continuously varying frequency responses of said left and right channels in accordance with said level of the noise component when said noise component decreases below a predetermined level.

2. A noise suppression apparatus for an FM receiver comprising:
   amplifying means (25) for extracting noise component in an intermediate frequency signal;
   noise detecting means (26,27) for outputting a control signal when said noise component exceeds a predetermined level;
   gate means (3) through which an FM detected signal passes, said gate means being closed by said control signal to inhibit the passage of said FM-detected signal;
   d-c signal producing means (28) for producing a d-c signal in accordance with an output level of said amplifying means (25) to control a gain of said amplifying means (25);
   stereo separation control means (22) for continuously varying a stereo separation between a left channel and a right channel of a speaker output in accordance with said d-c signal when said d-c signal decreases below a predetermined level; and
   high frequency response control means (23) for continuously varying frequency responses of said left and right channels in accordance with said d-c signal when said d-c signal decreases below a predetermined level.

3. A noise suppression apparatus for an FM receiver comprising:
   first amplifying means (6,7) for extracting a noise component from an FM detected signal;
   first noise detecting means (8,9) for outputting a first control signal when an output of said first amplifying means (6,7) exceeds a predetermined level;
   first d-c signal producing means for producing a first d-c signal in accordance with an output level of said first amplifying means (6,7) to control a gain of said first amplifying means (6,7);
   a second amplifying means (25) for extracting a high frequency component of noise in an intermediate frequency signal;
   second noise detecting means (26,27) for outputting a second control signal when an output of said second amplifying means (25) exceeds a predetermined level;
   second d-c signal producing means (28) for producing a second d-c signal in accordance with an output level of said second amplifying means (25) to control a gain of said second amplifying means;
   gate means (3) through which said FM detected signal passes, said gate means being closed by said first and second control signals to inhibit the passage of said FM-detected signal;

stereo separation control means (22) for continuously varying a stereo separation between a left channel and a right channel of a speaker output of the FM receiver in accordance with said first d-c signal when said first d-c signal decreases below a predetermined level; and high frequency response control means (23) for continuously varying frequency responses of said left and right channels in accordance with said first d-c signal when said first d-c signal decreases below a predetermined level.

4. A noise suppression apparatus for an FM receiver comprising:

first amplifying means (6,7) for extracting a noise component from an FM detected signal;

first noise detecting means (8,9) for outputting a first control signal when an output of said first amplifying (6,7) exceeds a predetermined level;

first d-c signal producing means (11) for producing a first d-c signal in accordance with an output level of said first amplifying means (6,7) to control a gain of said first amplifying means (6,7);

a second amplifying (25) for extracting a high frequency component of noise of in intermediate frequency signal;

second noise detecting means (26,27) for outputting a second control signal when an output of said second amplifying means (25) exceeds a predetermined level;

second d-c signal producing means (28) for producing a second d-c signal in accordance with an output level of said second amplifying means (25) to control a gain of said second amplifying means;

gate means (3) through which said FM detected signal passes, said gate means being closed by said first and second control signals to inhibit the passage of said FM-detected signal;

stereo separation control means (22) for continuously varying a stereo separation between a left channel and a right channel of a speaker output of the FM receiver in accordance with said second d-c signal when said second d-c signal decreases below a predetermined level; and high frequency response control means (23) for continuously varying frequency responses of said left and right channels in accordance with said second d-c signal when said second d-c signal decreases below a predetermined level.

* * * * *